United States Patent
Do et al.

(10) Patent No.: US 8,546,195 B2
(45) Date of Patent: Oct. 1, 2013

(54) SEMICONDUCTOR PACKAGE HAVING SEMICONDUCTOR DIE WITH INTERNAL VERTICAL INTERCONNECT STRUCTURE AND METHOD THEREFOR

(75) Inventors: Byung Tai Do, Singapore (SG); Seng Guan Chow, Singapore (SG); Heap Hoe Kuan, Singapore (SG); Linda Pei Ee Chua, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/335,631

(22) Filed: Dec. 22, 2011

(65) Prior Publication Data

US 2012/0094444 A1 Apr. 19, 2012

Related U.S. Application Data

(63) Continuation of application No. 12/044,803, filed on Mar. 7, 2008, now Pat. No. 8,084,302.

(51) Int. Cl.
*H01L 23/485* (2006.01)

(52) U.S. Cl.
USPC .................................. 438/127; 257/E23.019

(58) Field of Classification Search
USPC .................. 257/E23.011, E23.019; 438/106, 438/107, 109, 127
See application file for complete search history.

(56) References Cited

U.S. PATENT DOCUMENTS

| | | | |
|---|---|---|---|
| 6,143,649 A * | 11/2000 | Tang | 438/640 |
| 6,222,260 B1 | 4/2001 | Liang et al. | |
| 6,750,547 B2 | 6/2004 | Jeung et al. | |
| 6,774,499 B1 * | 8/2004 | Yang | 257/786 |
| 2004/0178495 A1 * | 9/2004 | Yean et al. | 257/723 |

* cited by examiner

*Primary Examiner* — Fernando L Toledo
*Assistant Examiner* — Daniel Shook
(74) *Attorney, Agent, or Firm* — Robert D. Atkins; Atkins & Associates, P.C.

(57) ABSTRACT

A semiconductor wafer is made by forming a first conductive layer over a sacrificial substrate, mounting a semiconductor die to the sacrificial substrate, depositing an insulating layer over the semiconductor die and first conductive layer, exposing the first conductive layer and contact pad on the semiconductor die, forming a second conductive layer over the insulating layer between the first conductive layer and contact pad, forming solder bumps on the second conductive layer, depositing an encapsulant over the semiconductor die, first conductive layer, and interconnect structure, and removing the sacrificial substrate after forming the encapsulant to expose the conductive layer and semiconductor die. A portion of the encapsulant is removed to expose a portion of the solder bumps. The solder bumps are sized so that each extends the same outside the encapsulant. The semiconductor die are stacked by electrically connecting the solder bumps.

32 Claims, 8 Drawing Sheets

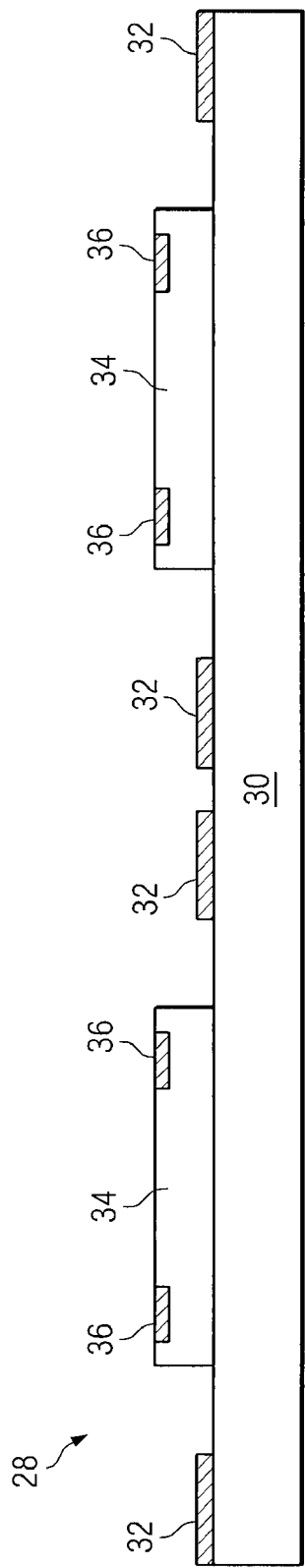
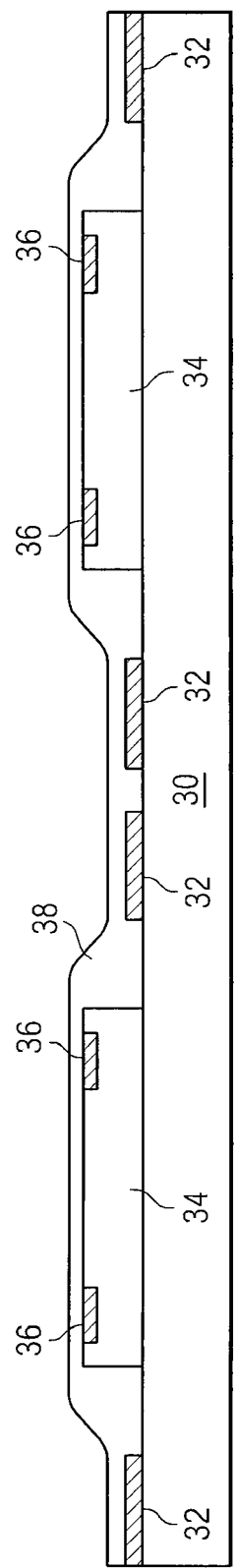

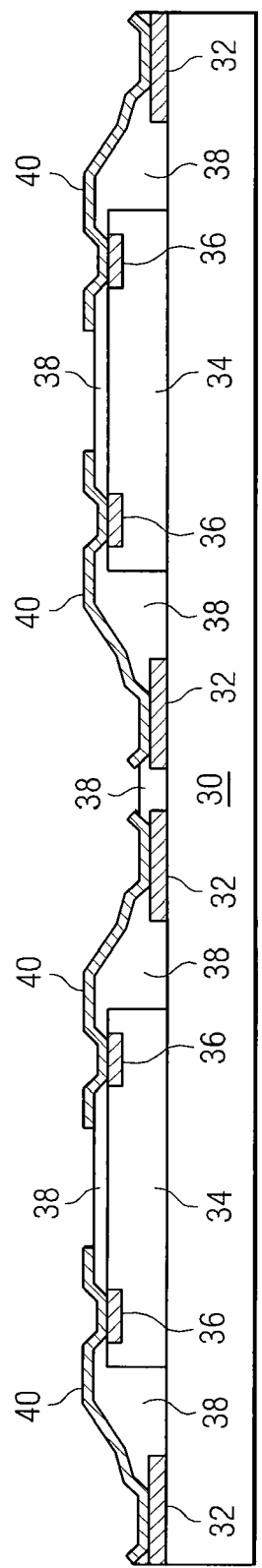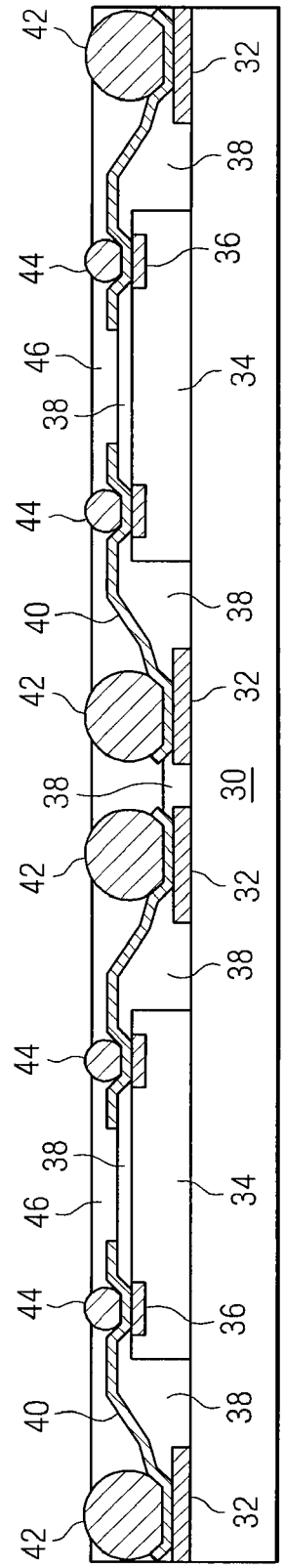
FIG. 1c
FIG. 1d

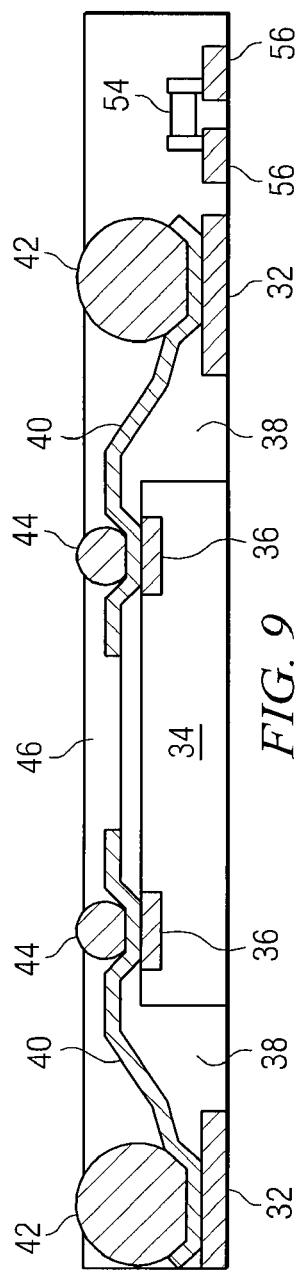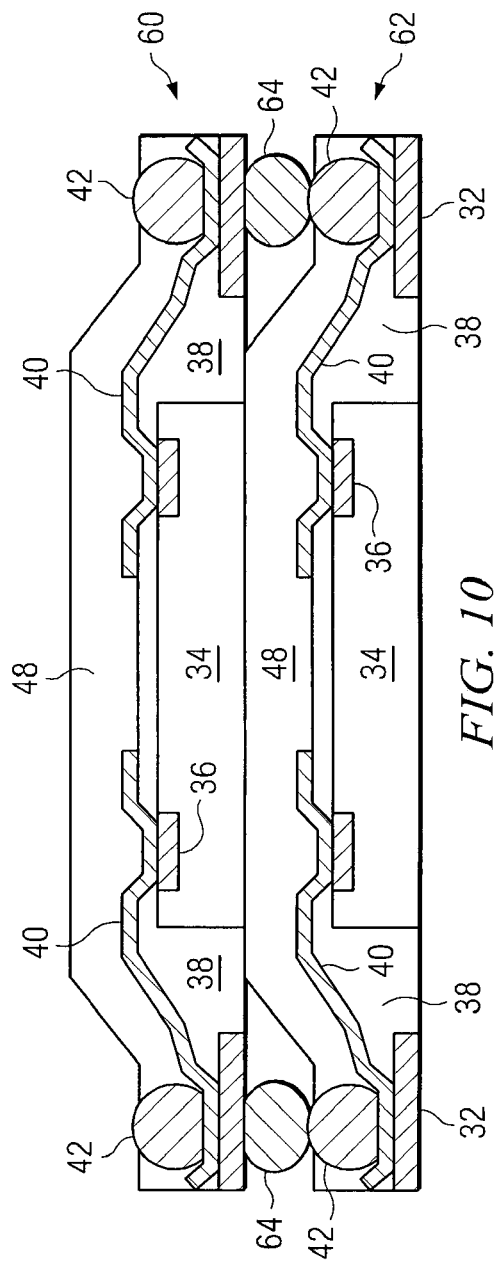

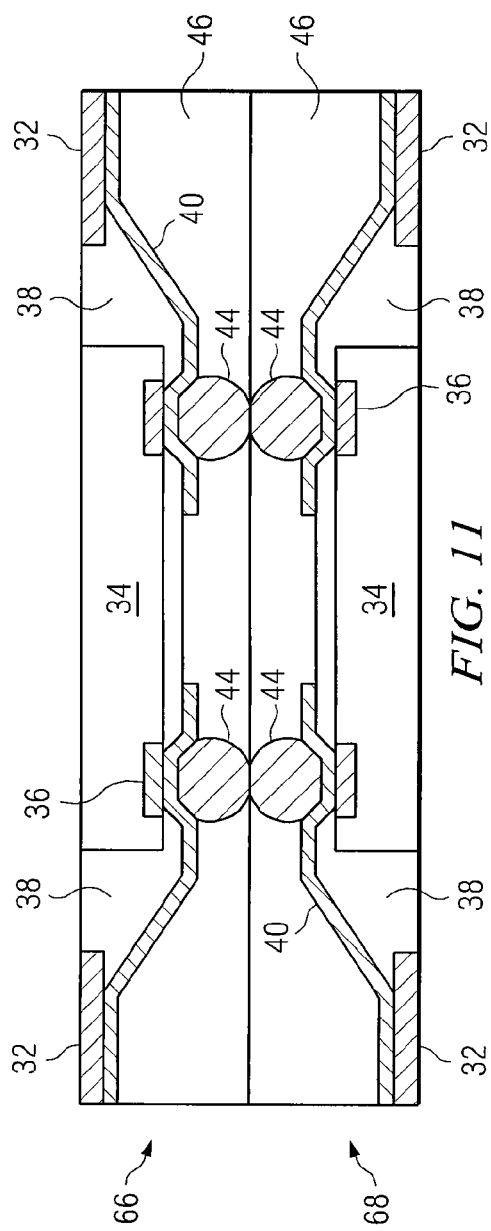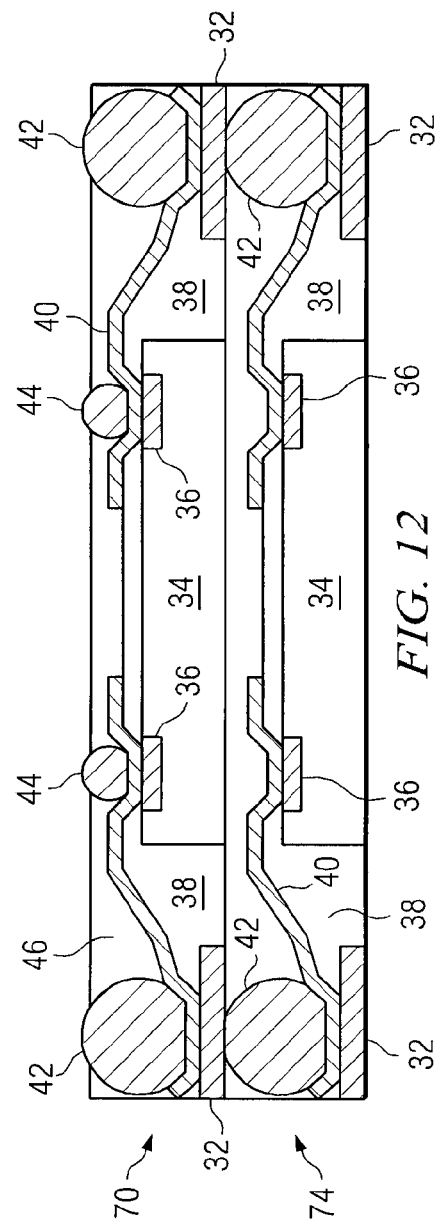

SEMICONDUCTOR PACKAGE HAVING SEMICONDUCTOR DIE WITH INTERNAL VERTICAL INTERCONNECT STRUCTURE AND METHOD THEREFOR

CLAIM OF DOMESTIC PRIORITY

The present application is a continuation of U.S. patent application Ser. No. 12/044,803, now U.S. Pat. No. 8,084, 302, filed Mar. 7, 2008, and claims priority to the foregoing parent application pursuant to 35 U.S.C. §120.

FIELD OF THE INVENTION

The present invention relates in general to semiconductor devices and, more particularly, to a semiconductor package having semiconductor die with an internal vertical interconnect structure.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. For applications requiring high-density components, e.g., stacked memory devices or internal stacked modules (ISM), it is desirable to provide interconnect structures on front and back sides of the semiconductor package. Bond wires are commonly used to interconnect the stacked packages. However, bond wires have a loop height control requirement, which causes the semiconductor package to have an undesirable thickness. The long and uneven lengths of the wire bonds also exhibit differing propagation delays which causes timing issues in high-speed applications.

A need exists to form ISM packages having an interconnect structure on both sides of the package without using bond wires. The interconnect structure should allow for thinner packages and even propagation delays.

SUMMARY OF THE INVENTION

In one embodiment, the present invention is a method of making a semiconductor device comprising the steps of providing a substrate, forming a first conductive layer over the substrate, mounting a semiconductor die having a contact pad vertically offset from the first conductive layer to the substrate, and forming an insulating layer with a sloped contour around the semiconductor die and first conductive layer. The method further includes the steps of forming a second conductive layer that follows the sloped contour of the insulating layer and connects the first conductive layer and contact pad, forming a plurality of bumps on the second conductive layer opposite the first conductive layer to provide vertical electrical interconnect through the semiconductor device, depositing a molding compound over the semiconductor die, second conductive layer, and plurality of bumps, and removing the substrate to expose the first conductive layer.

In another embodiment, the present invention is a method of making a semiconductor wafer comprising the steps of providing a substrate, forming a first conductive layer over the substrate, mounting a semiconductor die to the substrate with a contact pad vertically offset from the first conductive layer, and forming an insulating layer having a sloped contour over the semiconductor die and first conductive layer. The method further includes the steps of forming a second conductive layer over the insulating layer and connecting the first conductive layer and contact pad, forming an interconnect structure on the second conductive layer opposite the first conductive layer to provide vertical electrical interconnect through the semiconductor device, and removing the substrate to expose the first conductive layer.

In another embodiment, the present invention is a method of making a semiconductor wafer comprising the steps of providing a substrate, forming a first conductive layer over the substrate, mounting a semiconductor die to the substrate, forming an internal vertical interconnect structure by forming a second conductive layer having a sloped contour between the first conductive layer and a contact pad on the semiconductor die, and forming an interconnect structure on the second conductive layer opposite the first conductive layer, and removing the substrate to expose the first conductive layer.

In another embodiment, the present invention is a semiconductor device comprising the steps of providing a first conductive layer, providing a semiconductor die with a contact pad vertically offset from the first conductive layer, forming a second conductive layer having a sloped contour between the first conductive layer and contact pad, and forming an interconnect structure on the second conductive layer opposite the first conductive layer to provide vertical electrical interconnect through the semiconductor device.

BRIEF DESCRIPTION OF THE DRAWINGS

FIGS. 1a-1e illustrate a process of forming a semiconductor device with an internal vertical interconnect structure using large and small solder bumps and RDL;

FIG. 9 illustrates the semiconductor device with internal vertical structure using large and small solder bumps and a discrete passive device;

FIG. 10 illustrates stacked semiconductor devices with internal vertical structure using large solder bumps and stepped molding compound;

FIG. 11 illustrates face-to-face stacked semiconductor devices with internal vertical structure using small solder bumps;

FIG. 12 illustrates stacked semiconductor devices with internal vertical structure using large solder bumps;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited over the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1E:
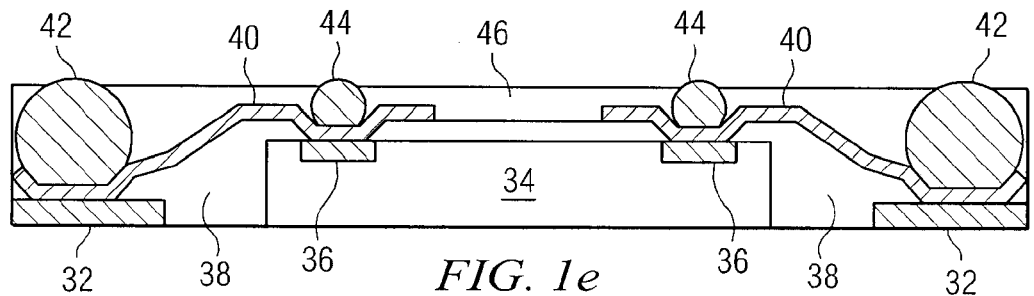

FIGS. 1a-1e illustrate a process of forming a semiconductor device having an internal vertical interconnect structure formed over semiconductor wafer 28. FIG. 1a shows a low cost dummy or sacrificial substrate 30. Substrate 30 can be made with silicon (Si), ceramic, or glass. An electrically conductive layer 32 is patterned and deposited over substrate 30 using a physical vapor deposition (PVD), chemical vapor deposition (CVD), evaporation, sputtering, electrolytic plating, electroless plating, screen printing, photolithography, etch-back, or combination of processes. Conductive layer 32 can be made with aluminum (Al), aluminum alloy, copper (Cu), tin (Sn), nickel (Ni), gold (Au), silver (Ag), or other electrically conductive material. Conductive layer 32 operates as a backside external contact pads for later-formed solder bumps, which are part of the internal vertical electrical interconnect structure.

Semiconductor die 34 is mounted to substrate 30 with a die attach adhesive such as thermal epoxy. Each semiconductor die 34 has active and passive devices, conductive layers, and dielectric layers on its active surface according to the electrical design of the die. Semiconductor die 34 further includes contact pads 36 for routing signals to the circuits in the die. Contact pads 36 are disposed at a different level or elevation with respect to conductive layer 32.

In FIG. 1b, a thick insulating layer 38 is formed over substrate 30, conductive layer 32, and semiconductor die 34. The thickness of insulating layer 38 ranges from 20-200 μm. The insulating layer 38 is made with silicon nitride (SixNy), silicon dioxide (SiO2), silicon oxynitride (SiON), tantalum pentoxide (Ta2O5), zircon (ZrO2), aluminum oxide (Al2O3), or other material having dielectric insulation properties. The insulating layer can be dispensed as liquid encapsulant followed by spin-coating or spray coating dielectric material with different viscosity. The insulating layer can also be pressed or coated to cover the semiconductor die. A portion of insulating layer 38 is removed by an etching process to expose contact pads 36 and conductive layer 32. The remaining portion of insulating layer 38 is sloped to account for the different levels between conductive layer 32 and contact pads 36. Alternately, contact pads 36 and conductive layer 32 can be exposed using a film-assistant molding process, i.e. without removing any portion of insulating layer 38.

In FIG. 1c, a metal conduction layer 40 is formed over insulating layer 38 using a patterning and deposition process. The metal conduction layer 40 is a redistribution layer (RDL). RDLs 40 can be made with Al, Ni, nickel vanadium (NiV), Cu, or Cu alloy. RDLs 40 can be made by an evaporation, sputtering, electrolytic plating, electroless plating, screen printing, photolithography, etch-back, or combination of these processes. RDLs 40 can be made with a single layer, or multiple layers using an adhesion layer of titanium (Ti), titanium tungsten (TiW), or chromium (Cr). RDLs 40 follow the contour of insulating layer 38 to span the different levels between conductive layer 32 and contact pads 36. Accordingly, RDLs 40 operate as an intermediate conduction layer or interconnect formed over insulating layer 38 to electrically connect contact pads 36 and conductive layer 32 and route electrical signals to semiconductor die 34.

In FIG. 1d, a metal layer is deposited over contact pads 36 and conductive layer 32 using an evaporation, electrolytic plating, electroless plating, screen printing, photolithography, etch-back, or combination of these processes to form under bump metallization (UBM) layer. The UBM can be made with Ti, Ni, NiV, Cu, or Cu alloy. The UBMs can be a multiple metal stack with adhesion layer, barrier layer, and wetting layer. The adhesion layer is made with Ti, Cr, Al, TiW, or TiN. The barrier layer can be made with Ni, NiV, CrCu, or TiW. The wetting layer can be made with Cu, Au, or Ag. An electrically conductive solder material is deposited over the UBM through an evaporation, electrolytic plating, electroless plating, ball drop, or screen printing process. The solder material can be any metal or electrically conductive material, e.g., Sn, Ni, Au, Ag, lead (Pb), bismuthinite (Bi) and alloys thereof. For example, the solder material can be eutectic Sn/Pb, high lead, lead free, or other solder materials. The solder material is reflowed by heating the solder material above its melting point to form spherical balls or bumps 42 and 44 on conductive layer 32 and contact pad 36, respectively. In some applications, solder bumps 42 and 44 are reflowed a second time to improve electrical contact to the UBM. A plurality of solder bumps like 42 and 44 is formed over the semiconductor device as part of the internal vertical interconnect structure. Besides of solder balls/bumps, internal interconnect structure can be also made with multiple stud bumps (e.g., Aus stud bumps), conductive pillars (Cu pillar), and conductive protrusions.

A molding compound or encapsulant 46 is deposited over the structure formed in FIGS. 1a-1d. The molding compound 46 is non-conductive and environmentally protects the semiconductor device from external elements and contaminants. Molding compound 46 can be made with epoxy acrylate or other polymer material and applied by transfer molding, liquid encapsulant molding, or other molding process. The molding compound also acts as a wafer support structure during backgrinding to remove sacrificial substrate 30.

Solder bumps 44 are made smaller than solder bumps 42 so that both have substantially the same amount of exposure outside molding compound 46. In one embodiment, solder bumps 42 are 75 μm in height and solder bumps 44 are 25 μm in height. A portion of molding compound 46 can be removed by an etching or grinding process to expose the solder bumps 42 and 44. Alternatively, a film-assistant molding process can be used to expose a portion of the solder bump. A small portion of solder bumps 42 and 44 extends outside molding compound 46 to metallurgically and electrically connect to other semiconductor packages, as described below. For example, solder bumps 42 and 44 may extend a few micrometers outside molding compound 46.

With the front-side wafer support structure in place, sacrificial substrate 30 from FIG. 1d is removed by a combination of backgrinding, silicon wet etching, plasma etching, or chemical mechanical polishing (CMP). That is, sacrificial substrate 30 is removed after depositing encapsulant 46. The backgrinding can be performed with a mechanical grinder followed by wet etching. The silicon wet etchant can be 0.5-10% HF and 0.5-10% hydrogen peroxide (H2O2). Wafer 28 is singulated into separate semiconductor die 34, as shown in FIG. 1e.

Figure 2:
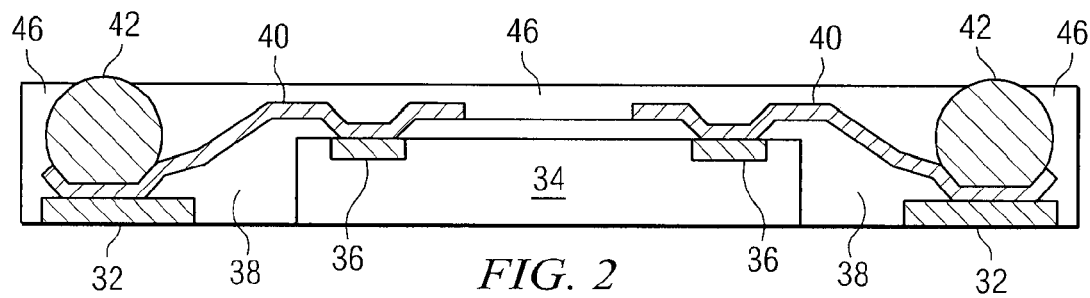
FIG. 2 illustrates the semiconductor device with internal vertical structure using large solder bumps.
Figure 3:
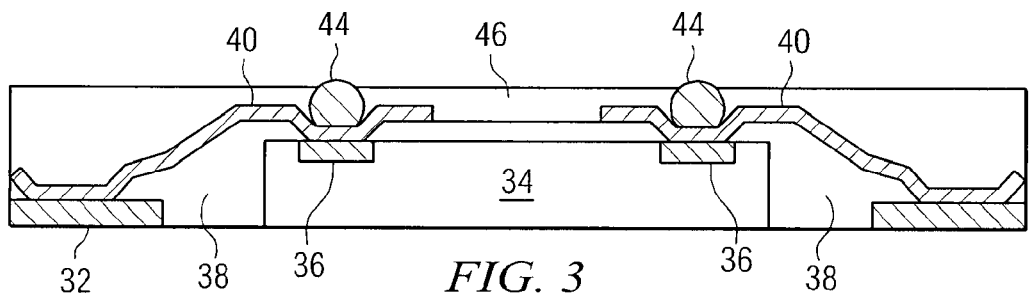
FIG. 3 illustrates the semiconductor device with internal vertical structure using small solder bumps.
Figure 4:
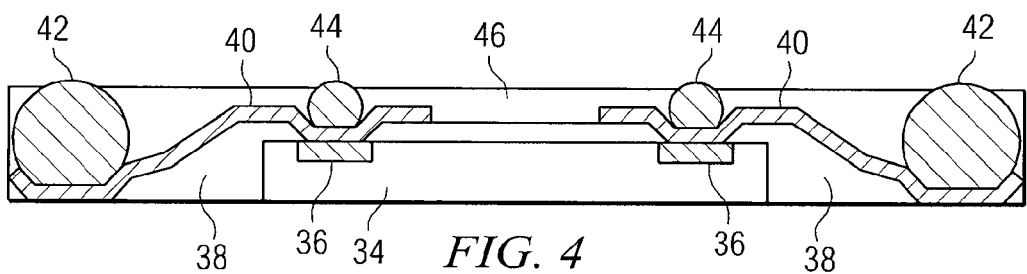
FIG. 4 illustrates the semiconductor device with internal vertical structure using large and small solder bumps without the backside conductive layer.

FIG. 2 illustrates semiconductor die 34 made with solder bumps 42 formed over conductive layer 32, but without the smaller solder bumps like 44 formed over contact pads 36. Conductive layer 32, solder bumps 42, and RDL 40 form the internal vertical interconnect structure. The lateral side of conductive layer 32 may optionally be covered by molding compound 46. FIG. 3 shows semiconductor die 34 made with solder bumps 44 formed over contact pads 36, but without the larger solder bumps like 42 formed over conductive layer 32. In this case, conductive layer 32, solder bumps 44, and RDL 40 form the internal vertical interconnect structure. FIG. 4 shows semiconductor die 34 made with solder bumps 42 and 44 formed over RDL 40, but without backside conductive layer 32.

Figure 5:
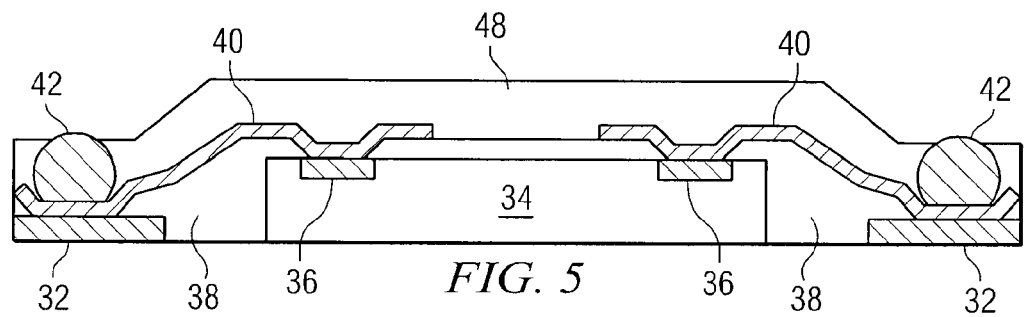
FIG. 5 illustrates the semiconductor device with internal vertical structure using large solder bumps and stepped encapsulant.

FIG. 5 shows semiconductor die 34 made with solder bumps 42 formed over conductive layer 32, but without the smaller solder bumps like 44 formed over contact pads 36. Conductive layer 32, solder bumps 42, and RDL 40 form the internal vertical interconnect structure. The molding compound 48 steps up from solder bumps 42 to a level above semiconductor die 34 about equal to a height of solder bumps 42. For example, the step height is about equal to a height of solder bumps 42.

Figure 6:
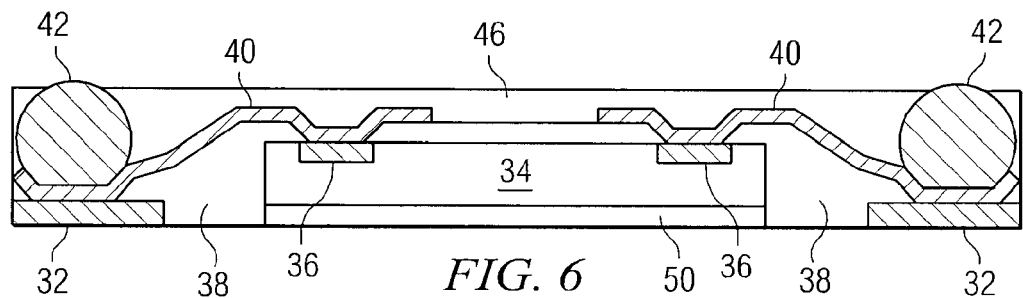
FIG. 6 illustrates the semiconductor device with internal vertical structure using large solder bumps and die paddle.

FIG. 6 illustrates semiconductor die 34 disposed on die paddle 50. The interconnect structure has solder bumps 42 formed over conductive layer 32, but without the smaller solder bumps like 44 formed over contact pads 36.

Figure 7:
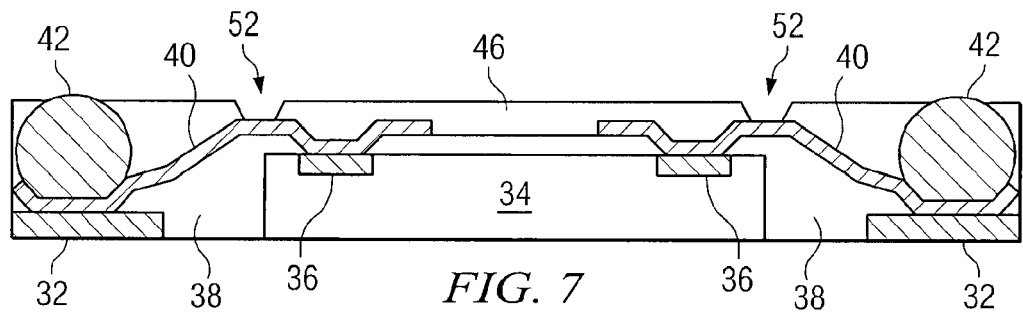
FIG. 7 illustrates the semiconductor device with internal vertical structure using large solder bumps and vias formed to electrically connect to RDL.

FIG. 7 illustrates semiconductor die 34 with solder bumps 42 formed over conductive layer 32, but without the smaller solder bumps like 44 formed over contact pads 36. Conductive layer 32, solder bumps 42, and RDL 40 form the internal vertical interconnect structure. A portion of molding compound 46 is removed to create vias 52 in order to expose RDL 40. Solder bumps can be formed in vias 52 to electrically connect to RDL 40.

Figure 8:
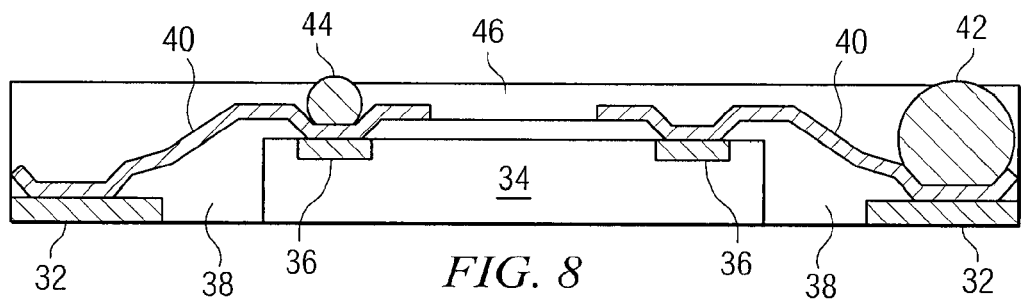
FIG. 8 illustrates the semiconductor device with internal vertical structure using large and small solder bumps on opposite sides of the die.

FIG. 8 illustrates semiconductor die 34 made with solder bumps 42 formed over conductive layer 32, but without the smaller solder bumps like 44 formed over contact pads 36, on the right side of the package. Semiconductor die 34 has solder bumps 44 formed over contact pads 36, but without the larger solder bumps like 42 formed over conductive layer 32, on the left side of the package. A combination of conductive layer 32, solder bumps 42 and 44, and RDL 40 form the internal vertical interconnect structure.

FIG. 9 shows the semiconductor package made by the process of FIGS. 1a-1e and further including a discrete passive circuit element 54, e.g., resistor, capacitor, or inductor, electrically connected to contact pads 56, to represent a system in a package (SiP).

FIG. 10 shows stacked semiconductor packages 60 and 62 made with the molding compound step up configuration of FIG. 5. Packages 60 and 62 are interconnected with solder bumps 64. A small portion of solder bumps 42, e.g., a few micrometers, extends outside the molding compound to metallurgically and electrically connect to solder bumps 64.

FIG. 11 shows face-to-face stacked semiconductor packages 66 and 68 made with the solder bump configuration of FIG. 3. Semiconductor package 66 is inverted to metallurgically and electrically connect to package 68 through solder bumps 44. A small portion of solder bumps 44, e.g., a few micrometers, extends outside the molding compound to metallurgically and electrically connect to the opposing package.

FIG. 12 shows stacked semiconductor packages 70 and 74 made with a combination of the solder bump configurations of FIGS. 1e and 2. A small portion of solder bumps 42 and 44, e.g., a few micrometers, extends outside the molding compound to metallurgically and electrically connect to the adjacent package, e.g., solder bumps 42 of package 74 metallurgically and electrically connect to conductive layer 32 of package 70.

FIGS. 10-12 illustrate various efficient stacking techniques using the semiconductor packages of FIGS. 1e and 2-9. The internal vertical interconnect structure using backside conductive layer 32, partially exposed solder bumps 42 and 44, and RDL 40 simplifies the stacking arrangement of the semiconductor packages, reduces thickness of the package, and provides for even propagation delays through the vertical interconnect structure. In addition, the semiconductor packages of FIGS. 1e and 2-9 require no wire bonding, spacers, film, or epoxy, which simplifies the manufacturing process and saves cost.

The stacking options are useful for memory devices. For example, a plurality of memories of the same or different types (two DRAMs, or one DRAM and one FLASH) can be contained in one package. The stacked packages can be used to replace existing logic and mixed signal stacking die structure as ensure known good units.

Figure 13:
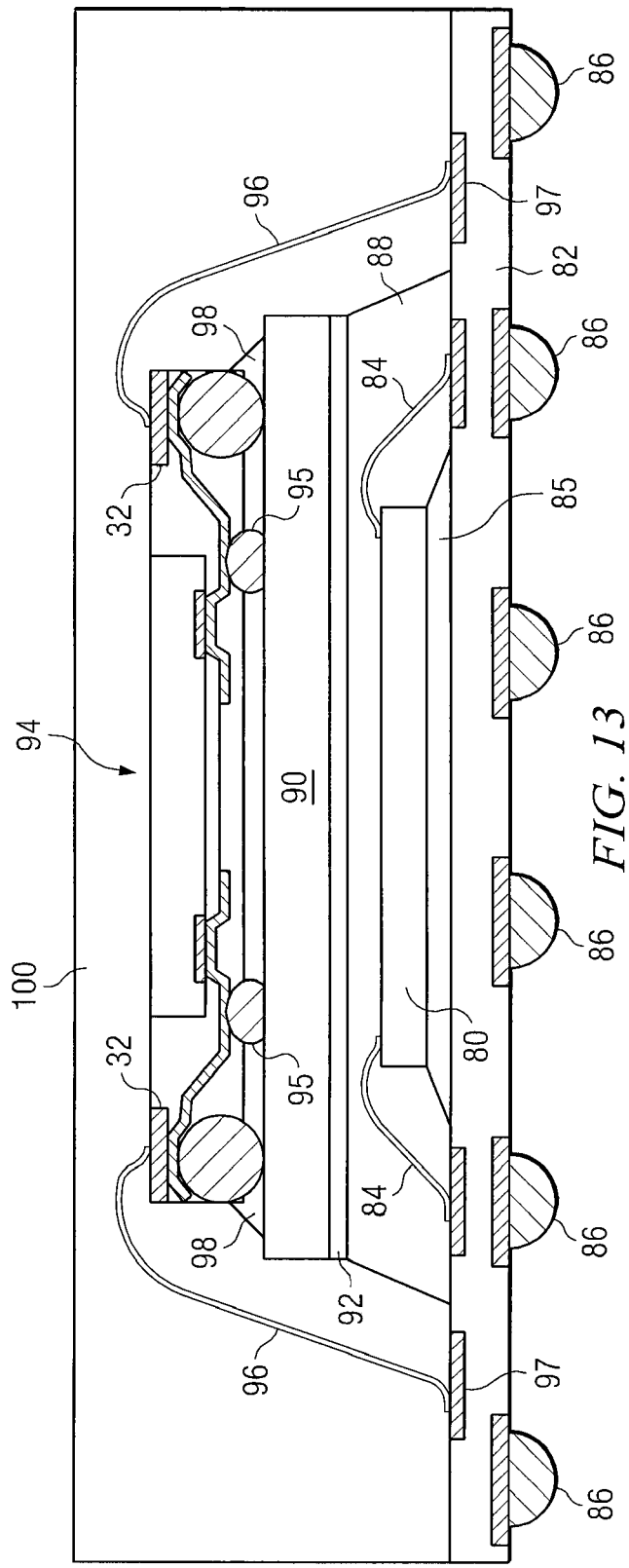
FIG. 13 illustrates package in package using the semiconductor device with internal vertical structure.
Figure 14:
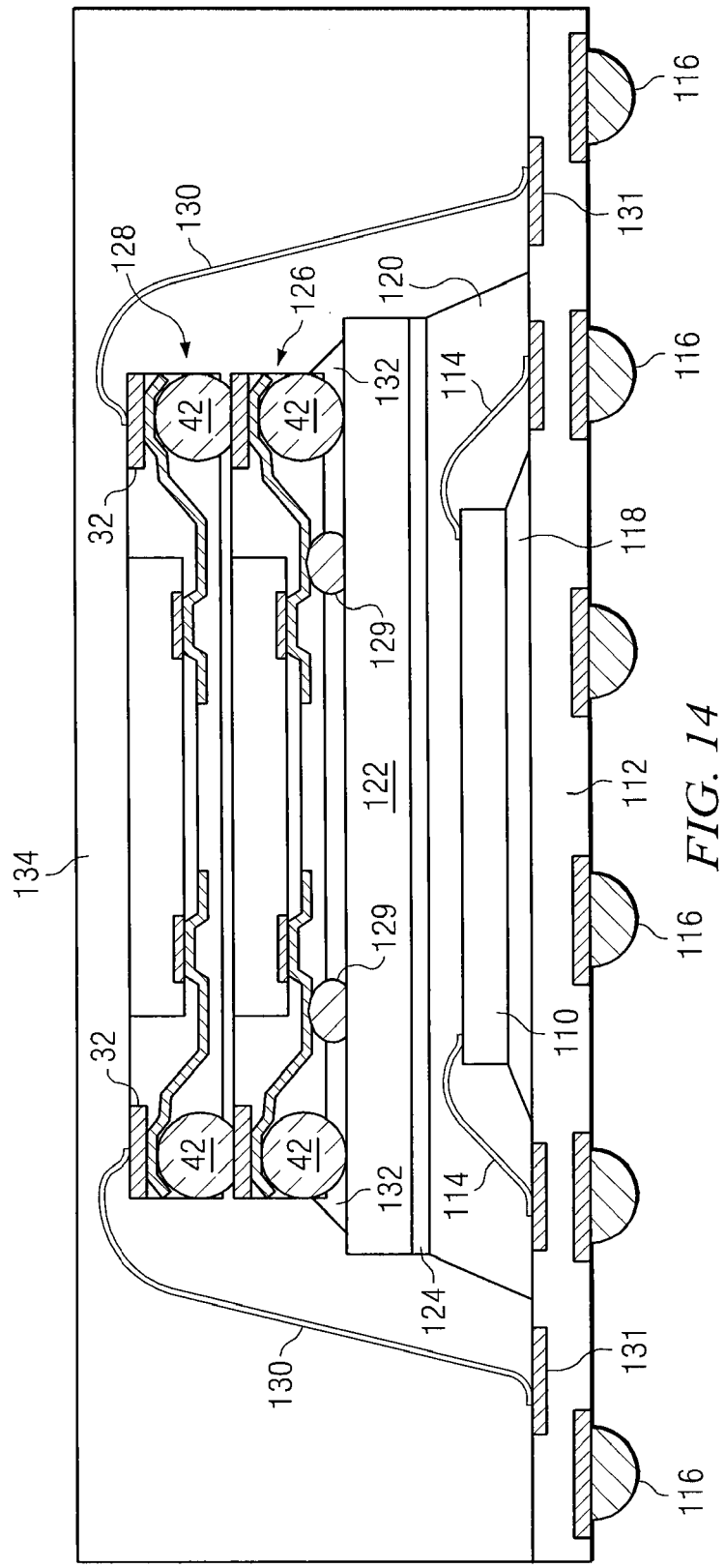
FIG. 14 illustrates another embodiment of the package in package using stacked semiconductor devices with internal vertical structure.

In other embodiments such as shown in FIGS. 13 and 14, the stackable semiconductor packages can be used with package in package (PiP) and internal stacking module (ISM) configurations. In FIG. 13, semiconductor die 80 is connected to chip carrier substrate 82 with wire bonds 84 and adhesive 85. Chip carrier substrate 82 has an electrical interconnect structure shown as solder bumps 86 and contact pads 97, as well as internal conductive layers. A molding compound 88 is formed over semiconductor die 80. Flip chip 90 is connected to molding compound 88 with adhesive 92. A semiconductor package 94, as described in FIG. 7, is metallurgically and electrically connected to flip chip 90 using solder bumps 42 and solder bumps 95 formed in vias 52. Bond wires 96 electrically connect conductive layer 32 on package 94 to contact pads 97 on chip carrier substrate 82. An underfill material 98 is deposited under package 94. An encapsulant or molding compound 100 is formed over the PiP shown in FIG. 13. Electrical signals can be routed between package 94, flip chip 90, and semiconductor die 80, as well as to external devices, in the PiP configuration.

In FIG. 14, semiconductor die 110 is connected to chip carrier substrate 112 with wire bonds 114 and adhesive 118. Chip carrier substrate 112 has an electrical interconnect structure shown as solder bumps 116 and contact pads 131, as well as internal conductive layers. A molding compound 120 is formed over semiconductor die 110. Flip chip 122 is connected to molding compound 120 with adhesive 124. Stacked semiconductor packages 126 and 128, as described in FIGS. 2 and 7, are metallurgically and electrically connected to flip chip 122 using solder bumps 42 and solder bumps 129 formed in vias 52. Bond wires 130 electrically connect conductive layer 32 of package 128 to contact pads 131 on chip carrier substrate 112. An underfill material 132 is deposited under package 126. An encapsulant or molding compound 134 is formed over the PoP. In one embodiment, semiconductor die 110 is a microprocessor, flip chip 122 is a controller, semiconductor package 126 is flash memory, and semiconductor package 128 is DRAM. Electrical signals can be routed between package 126-128, flip chip 122, and semiconductor die 110, as well as to external devices, according to the PiP configuration.

In summary, the internal vertical interconnect structure of solder bumps 42 and 44 and RDL 40 enhance the stacking capability of flip chip and chip scale packages, while reducing thickness of the package. The dielectric material 38 covers semiconductor die and external interconnections. Conductive layer 32 and solder bumps 42 and 44 are exposed through molding compound 46. RDL 40 electrically connect contact pads 34 to the partially exposed solder bumps. The internal vertical interconnection can use solder balls, stack of multiple stud bumps, conductive pillars, and conductive protrusions. The stackable semiconductor packages can be made without wire bonds, spacers, film, or epoxy, which simplifies the manufacturing process and saves cost. The interconnect structure as described herein provides for thinner packages and even propagation delays.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive layer over the substrate;
   mounting a semiconductor die including a contact pad vertically offset from the first conductive layer to the substrate;
   forming an insulating layer including a sloped contour around the semiconductor die and first conductive layer;
   forming a second conductive layer that follows the sloped contour of the insulating layer and connects the first conductive layer and contact pad;
   forming a plurality of bumps on the second conductive layer opposite the first conductive layer to provide vertical electrical interconnect through the semiconductor device;
   depositing a molding compound over the semiconductor die, second conductive layer, and plurality of bumps; and
   removing the substrate to expose the first conductive layer.

2. The method of claim 1, further including forming a first bump over the first conductive layer larger than a second bump formed over the contact pad such that the first and second bumps have a substantially equal exposure outside the molding compound.

3. The method of claim 1, further including sloping the molding compound from the plurality of bumps over the first conductive layer to over the semiconductor die.

4. The method of claim 1, further including forming a via in the molding compound to expose the second conductive layer.

5. The method of claim 1, further including mounting a passive circuit element to the semiconductor device.

6. The method of claim 1, further including vertically stacking a plurality of semiconductor devices and electrically connecting the plurality of bumps of the plurality of semiconductor devices.

7. A method of making a semiconductor device, comprising:
   providing a substrate;
   forming a first conductive layer over the substrate;
   mounting a semiconductor die to the substrate including a contact pad vertically offset from the first conductive layer;
   forming an insulating layer including a sloped contour over the semiconductor die and first conductive layer;
   forming a second conductive layer over the insulating layer and connecting the first conductive layer and contact pad;
   forming an interconnect structure on the second conductive layer opposite the first conductive layer to provide vertical electrical interconnect through the semiconductor device; and
   removing the substrate to expose the first conductive layer.

8. The method of claim 7, wherein forming the interconnect structure includes a plurality of bumps, stacks of stud bumps, conductive pillars, or conductive protrusions in electrical contact with the second conductive layer.

9. The method of claim 7, further including:
   depositing an encapsulant over the semiconductor die, first conductive layer, second conductive layer, and interconnect structure; and
   forming the interconnect structure with a first bump formed over the first conductive layer larger than a second bump formed over the contact pad.

10. The method of claim 7, further including:
    stacking a plurality of semiconductor devices; and
    electrically connecting the stacked semiconductor devices through the interconnect structure.

11. The method of claim 7, further including disposing a die paddle on a backside of the semiconductor die opposite the contact pad.

12. The method of claim 7, further including:
    depositing an encapsulant over the semiconductor die, first conductive layer, second conductive layer, and interconnect structure; and
    forming a via in the encapsulant to expose the second conductive layer.

13. The method of claim 7, further including mounting a passive circuit element to the semiconductor device.

14. A method of making a semiconductor device, comprising:
   providing a substrate;
   forming a first conductive layer over the substrate;
   mounting a semiconductor die to the substrate;
   forming an internal vertical interconnect structure by forming a second conductive layer including a sloped contour between the first conductive layer and a contact pad on the semiconductor die, and forming an interconnect structure on the second conductive layer opposite the first conductive layer; and
   removing the substrate to expose the first conductive layer.

15. The method of claim 14, wherein forming the internal vertical interconnect structure further includes:
   forming an insulating layer including a sloped contour over the substrate and around the semiconductor die; and
   forming the second conductive layer over the insulating layer.

16. The method of claim 14, wherein the interconnect structure includes a plurality of bumps, stacks of stud bumps, conductive pillars, or conductive protrusions in electrical contact with the second conductive layer.

17. The method of claim 14, further including:
   depositing an encapsulant over the semiconductor die, first conductive layer, second conductive layer, and interconnect structure; and
   forming the interconnect structure with a first bump formed over the second conductive layer larger than a second bump formed over the contact pad.

18. The method of claim 14, further including:
   stacking a plurality of semiconductor devices; and
   electrically connecting the stacked semiconductor devices through the interconnect structure.

19. The method of claim 14, wherein forming the interconnect structure includes:
   forming a first bump over the first conductive layer; and
   forming a second bump smaller than the first bump over the contact pad.

20. A method of making a semiconductor device, comprising:
   providing a first conductive layer;
   providing a semiconductor die with a contact pad vertically offset from the first conductive layer;
   forming a second conductive layer including a sloped contour between the first conductive layer and contact pad;
   forming an interconnect structure on the second conductive layer opposite the first conductive layer to provide vertical electrical interconnect through the semiconductor device;
   depositing an encapsulant over the semiconductor die, second conductive layer, and interconnect structure; and
   removing a portion of the encapsulant to expose a portion of the interconnect structure.

21. The method of claim 20, further including forming an insulating layer including a sloped contour around the semiconductor die.

22. The method of claim 20, further including forming a sloped encapsulant from over the first conductive layer to over the semiconductor die.

23. The method of claim 20, further including forming a via in the encapsulant to expose the second conductive layer.

24. The method of claim 20, further including:
   stacking a plurality of semiconductor devices; and
   electrically connecting the stacked semiconductor devices through the interconnect structure.

25. A method of making a semiconductor device, comprising:
   providing a first conductive layer including a surface that is exposed at an outer surface of the semiconductor device;
   providing a semiconductor die;
   forming an insulating layer including a sloped contour around the semiconductor die;
   forming a second conductive layer over the insulating layer and connecting the first conductive layer and a contact pad of the semiconductor die;
   forming an interconnect structure on the second conductive layer opposite the first conductive layer to provide vertical electrical interconnect through the semiconductor device; and
   depositing an encapsulant over the semiconductor die, first conductive layer, second conductive layer, and interconnect structure.

26. The method of claim 25, wherein the interconnect structure includes a plurality of bumps, stacks of stud bumps, conductive pillars, or conductive protrusions in electrical contact with the second conductive layer.

27. The method of claim 25, wherein forming the interconnect structure includes:
   forming a first bump over the second conductive layer; and
   forming a second bump smaller than the first bump over the contact pad.

28. The method of claim 25, further including:
   stacking a plurality of semiconductor devices; and
   electrically connecting the stacked semiconductor devices through the interconnect structure.

29. A method of making a semiconductor device, comprising:
   providing a first conductive layer including a surface that is exposed at an outer surface of the semiconductor device;
   providing a semiconductor die;
   forming an internal vertical interconnect structure by forming a second conductive layer including a sloped contour between the first conductive layer and a contact pad on the semiconductor die, and forming an interconnect structure on the second conductive layer opposite the first conductive layer; and
   depositing an encapsulant over the semiconductor die, first conductive layer, second conductive layer, and interconnect structure.

30. The method of claim 29, wherein the interconnect structure includes a plurality of bumps, stacks of stud bumps, conductive pillars, or conductive protrusions in electrical contact with the second conductive layer.

31. The method of claim 29, wherein forming the interconnect structure includes:
   forming a first bump over the second conductive layer; and
   forming a second bump smaller than the first bump over the contact pad.

32. The method of claim 29, further including:
   stacking a plurality of semiconductor devices; and
   electrically connecting the stacked semiconductor devices through the interconnect structure.

* * * * *